United States Patent
Weaver et al.

(10) Patent No.: US 7,049,636 B2
(45) Date of Patent: May 23, 2006

(54) DEVICE INCLUDING OLED CONTROLLED BY N-TYPE TRANSISTOR

(75) Inventors: Michael S. Weaver, Princeton, NJ (US); Michael Hack, Lambertville, NJ (US); Min-Hao Michael Lu, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 10/281,218

(22) Filed: Oct. 28, 2002

(65) Prior Publication Data

US 2004/0079945 A1 Apr. 29, 2004

(51) Int. Cl.
*H01L 27/15* (2006.01)
*H01L 31/12* (2006.01)
*H01L 33/00* (2006.01)

(52) U.S. Cl. .......................... 257/83; 257/99; 438/30; 349/42

(58) Field of Classification Search ................ 257/461, 257/460, 459, 458, 462, 463, 464, 465, 466, 257/452, 79, 99, 100, 98, 103, 83; 349/42; 313/489, 106, 104, 491, 500, 504; 345/45, 345/47; 438/22, 29, 30
See application file for complete search history.

(56) References Cited

U.S. PATENT DOCUMENTS

| | | | |
|---|---|---|---|
| 5,567,953 A * | 10/1996 | Horinouchi et al. | ........ 250/551 |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,953,598 A * | 9/1999 | Hata et al. | ................... 438/164 |
| 6,097,147 A | 8/2000 | Baldo et al. | |
| 6,160,714 A * | 12/2000 | Green | ......................... 361/761 |
| 6,303,238 B1 | 10/2001 | Thompson et al. | |
| 6,337,102 B1 | 1/2002 | Forrest et al. | |
| 6,469,439 B1 * | 10/2002 | Himeshima et al. | ......... 313/506 |
| 6,476,416 B1 * | 11/2002 | Ikeda | ........................... 257/59 |
| 6,573,651 B1 * | 6/2003 | Adachi et al. | .............. 313/504 |
| 2001/0055828 A1 * | 12/2001 | Kaneko et al. | |
| 2003/0107560 A1 * | 6/2003 | Yumoto et al. | ............. 345/204 |

OTHER PUBLICATIONS

Min-Hao Michael Lu, "External Coupling in Organic Light-Emitting Devices", A Dissertation Presented to the Faculty of Princeton University in Candidacy for the Degree of Doctor of Philosophy Recommended for Acceptance by the Department of Electrical Engineering, Jan. 2002.

Lu, et al., "External coupling and cathode effects in organic light-emitting devices: modeling and experiments", Proceedings of SPIE, vol. 4464, pp. 187-196, 2002.

(Continued)

Primary Examiner—Hoai Pham
Assistant Examiner—Dana Farahani
(74) Attorney, Agent, or Firm—Kenyon & Kenyon LLP (57) ABSTRACT

A device and corresponding method are provided. The device includes an n-type transistor fabricated over a substrate, the n-type transistor having a gate and two current-carrying electrodes. The device also includes a non-inverted organic light emitting device fabricated over the substrate, the non-inverted organic light emitting device having an anode and a cathode. The cathode is connected to one of the current-carrying electrodes of the n-type transistor.

34 Claims, 8 Drawing Sheets

OTHER PUBLICATIONS

Lu, et al., "Optimization of external coupling and light emission in organic light-emitting devices: modeling and experiment", Journal of Applied Physics, vol. 91, No. 2, pp. 595-604, Jan. 15, 2002.

Lu, et al., "Improved external coupling efficiency in organic light-emitting devices on high-index substrates", International Electron Devices Meeting 2000, San Francisco, CA, Technical Digest, pp. 607-610, Dec. 10-13, 2000.

Lu, et al., "External coupling efficiency in planar organic light-emitting devices", Applied Physics Letters, vol. 78, No. 13, pp. 1927-1929, Mar. 26, 2001.

Forrest et al., U.S. Appl. No. 10/173,682, filed Jun. 18, 2002, entitled "Very Low Voltage, High Efficiency Pholed in a P-I-N Structure".

Lu et al., U.S. Appl. No. 09/931,948, filed Aug. 20, 2001, entitled "Transparent Electrodes".

* cited by examiner

DEVICE INCLUDING OLED CONTROLLED BY N-TYPE TRANSISTOR

RESEARCH AGREEMENTS

The claimed invention was made by, on behalf of, and/or in connection with one or more of the following parties to a joint university-corporation research agreement: Princeton University, The University of Southern California and Universal Display Corporation. The agreement was in effect on and before the date the claimed invention was made, and the claimed invention was made as a result of activities undertaken within the scope of the agreement.

FIELD OF THE INVENTION

The present invention relates to the field of devices including an organic light emitting device (OLED) device controlled by an n-type transistor.

BACKGROUND OF THE INVENTION

OLEDs are becoming increasingly desirable for a number of reasons. Many of the materials used to make such devices are relatively inexpensive, so organic light emitting devices have the potential for cost advantages over inorganic devices. In addition, the inherent properties of organic materials, such as their flexibility, may make them well suited for particular applications such as fabrication on a flexible substrate. In addition, the wavelength at which an organic emissive layer emits light may generally be readily tuned with appropriate dopants, while it may be more difficult to tune inorganic emissive materials.

OLEDs make use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Representative OLED materials and configurations are described in U.S. Pat. Nos. 5,707,745, 5,703,436, 5,834,893, 5,844,363, 6,097,147 and 6,303,238, which are incorporated herein by reference in their entirety.

SUMMARY OF THE INVENTION

A device and corresponding method are provided. The device includes an n-type transistor fabricated over a substrate, the n-type transistor having a gate and two current-carrying electrodes. The device also includes a non-inverted organic light emitting device fabricated over the substrate, the non-inverted organic light emitting device having an anode and a cathode. The cathode is connected to one of the current-carrying electrodes of the n-type transistor.

DETAILED DESCRIPTION

An embodiment of the present invention includes an n-type transistor fabricated over a substrate, the n-type transistor having a gate and two current-carrying electrodes. The device also includes a non-inverted organic light emitting device (OLED) fabricated over the substrate, the non-inverted organic light emitting device having an anode and a cathode. The most common OLED configuration has a cathode disposed over the anode, and may be referred to as a "non-inverted" OLED. Because an OLED having an anode disposed over the cathode, it may be referred to as a "inverted OLED". The cathode is connected to one of the current-carrying electrodes of the n-type transistor. By connecting the cathode of the OLED to the transistor, the embodiments of the present invention make the use of n-type transistors practical. N-type thin film transistors may significantly lower the cost as compared to the use of low temperature polysilicon (LTP) p-type transistors. Embodiments of the invention allow for lower driving voltages, and results in the current through the OLED and driving transistor being independent of current-voltage characteristics of the OLED, as will be further explained below. In a preferred embodiment, the n-type transistor may be an n-type thin film transistor, although other n-type transistors may be used.

The cathode of the OLED is connected to one of the current-carrying electrodes of the n-type transistor. This connection may be a "direct connection", where the cathode is in physical contact with the current-carrying electrode. Alternatively, the connection may be an "indirect connection", with one or more elements between the cathode and the current-carrying electrode. For example, a resistor, transistor or other element could be placed between the cathode and the current carrying electrode, and such a connection would be an "indirect connection". Both a "direct connection" and an "indirect connection" are within the scope of the present invention.

The n-type transistor used in embodiments of the present invention may be manufactured by any process. One example of a suitable process is a "back channel etch process", but other processes may be used, including variations of what is described herein. Further, any n-type transistor structures may be used, including variations of what is described herein, although amorphous thin film transistors may be particularly desirable because of their low cost. The n-type transistor may be one of: a) a polycrystalline silicon thin film transistor; b) an amorphous thin film transistor; c) a cadmium selenide thin film transistor; or d) an organic thin film transistor.

Figure 1:
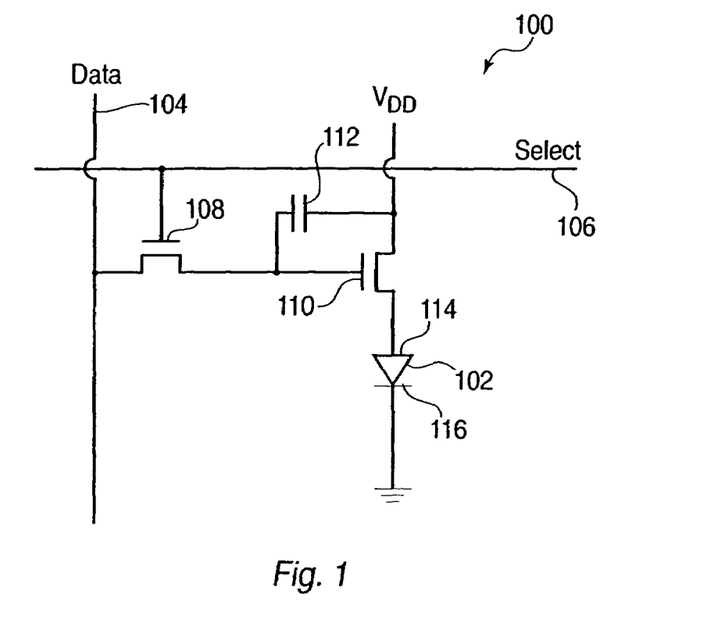
FIG. 1 shows a schematic diagram of a circuit for an OLED device.

A schematic diagram of a circuit 100 for an OLED device is shown in FIG. 1. Such a circuit could be used in a matrix display, for example. The circuit 100 includes an OLED 102, a data line 104, a select line 106, a select transistor 108, a transistor 110 and a storage capacitor 112. The OLED 102 has an anode 114 and a cathode 116. The anode 114 is connected to the transistor 110. The select transistor 108 is connected to select line 106, so that an appropriate voltage applied to the select line will turn on the transistor 108, allowing a voltage on data line 104 to be applied to the gate of driving transistor 110, turning on transistor 110. This configuration allows for the use of n-type transistors, but such a transistor would have its source connected to the anode of the OLED. As a result, the voltage sufficient to turn on the transistor 110 so that current can flow between the drain and the source and through the OLED, which is referred to herein as Vdata, must be sufficiently high to account for the voltage between the gate and source, Vgs, and the voltage drop across the OLED 102. A higher Vdata results in a higher power consumption. Also, because Vdata includes the voltage drop across the OLED, the current through the transistor and OLED is highly dependent on the I–V characteristics of the OLED. As a result, a display based on the circuit will be highly susceptible to problems due to non-uniformities in the OLEDs, as well as OLED degradation over time.

Figure 2:
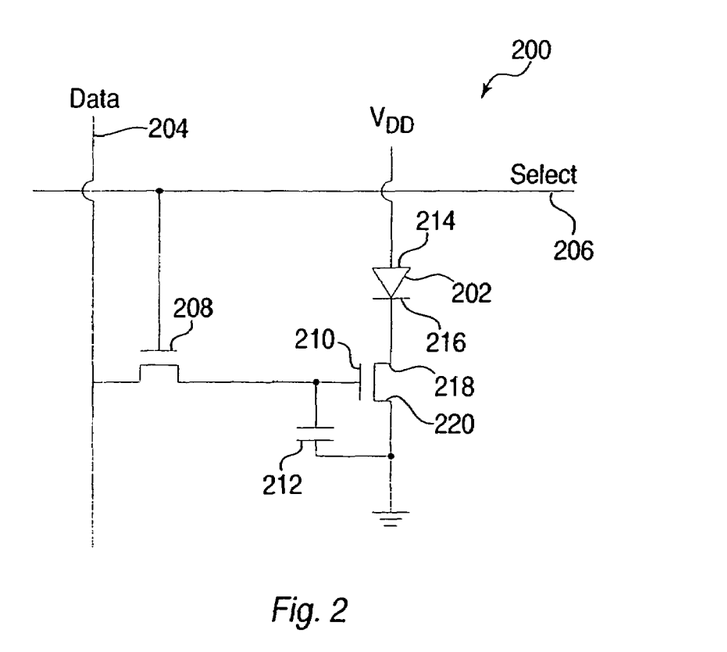
FIG. 2 shows a schematic diagram of a circuit for an OLED device.

A schematic diagram of a circuit 200 that may be used with embodiments of the present invention is shown in FIG. 2. In this embodiment, n-type transistors are also used, which may be n-type thin film transistors. N-type transistors have several advantages as compared to conventional devices that use p-type transistors. First, n-type transistors have higher mobilities than p-type transistors, and therefore can be made smaller for any given drive current. Second, n-type transistors can be made from amorphous silicon, unlike p-type transistors, thus reducing the cost of the device. Third, amorphous silicon n-type transistors may be favorably fabricated with lower temperature processing.

The circuit 200 includes non-inverted OLED 202, data line 204, select line 206, select transistor 208, n-type thin film transistor 210 and storage capacitor 212. The OLED 202 has an anode 214 and a cathode 216. The transistor 210 has two current-carrying electrodes, drain 218 and source 220 The circuit 200 of FIG. 2 differs from the circuit 100 of FIG. 1 in that the OLED 202 is connected to the drain 218 of transistor 210. In particular, the cathode 216 of OLED 202 is connected to the drain 218 of transistor 210. This configuration is advantageous as compared to the circuit of FIG. 1 in that Vdata, the voltage required to turn on and transistor 210, is lowered to be Vgs, the voltage across the gate and source of transistor 210, and does not include a voltage drop across the OLED 202. This voltage may be less than about 10 volts. Further, this configuration results in the current through the transistor 210 and through OLED 202 being substantially independent of the current-voltage characteristics of the OLED. This is advantageous because the current-voltage characteristics of an OLED may change over time, and may be different between a plurality of OLEDs that may be used together in a single device, leading to non-uniformities. A circuit such as shown in FIG. 2 could be realized with an inverted OLED having a bottom cathode, but such a configuration is usually less efficient than the inverted OLED of embodiments of the present invention.

The embodiments of the present invention may be used with any type of circuit, as long as it includes an OLED having a cathode connected to a current-carrying electrode of an n-type transistor. The particular form of the remaining circuit may vary. The circuit may include different or additional elements. For example, the circuit may additionally include correction circuitry to compensate for any non-uniformities in individual elements. The n-type transistor to which the cathode of the OLED is connected may be a "driving" transistor. A "driving" transistor as used herein is a transistor that determines the current that will flow through the OLED. While other transistors may affect or tweak the current flowing through the OLED, such as transistors used in correction circuits, these other transistors are not considered to be "driving" transistors. Other elements may replace the select transistor or storage capacitor, or they may be eliminated when not needed for a particular application.

Figure 3:
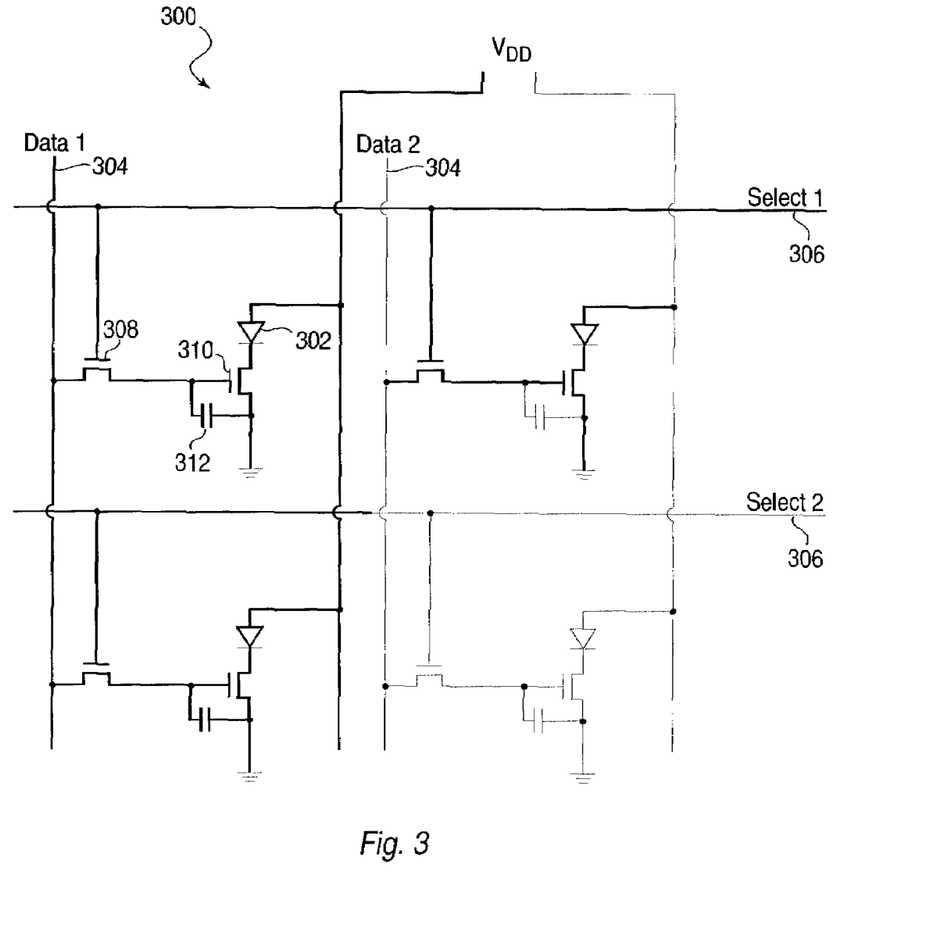
FIG. 3 shows an array configuration where a plurality of the devices embodiments of the present invention may be used together to form elements of an array.

The circuit 300 of FIG. 3 illustrates an array configuration where a plurality of the devices of embodiments of the present invention may be used together to form elements of an array 300 that may be used in devices such as displays. In particular, this configuration may be used with active matrix displays. FIG. 3 illustrates a plurality of circuits, each of which is a circuit such as that shown in FIG. 2. Each circuit is controlled by circuitry (not shown) to activate individual OLEDs 302 within the array as desired. The control circuitry is conventional and known to those of skill in the art, and therefore will not be further described. Each circuit is connected to a data line 304 and a select line 306, and contains n-type transistors 308 and 310, storage capacitor 312 and OLED 302, which function in the same manner as the corresponding elements in FIG. 2. In addition to the array configuration shown in FIG. 3, embodiments of the present invention may be used with one or more of the OLED and n-type transistor circuits to form a lighting element.

Figure 4:
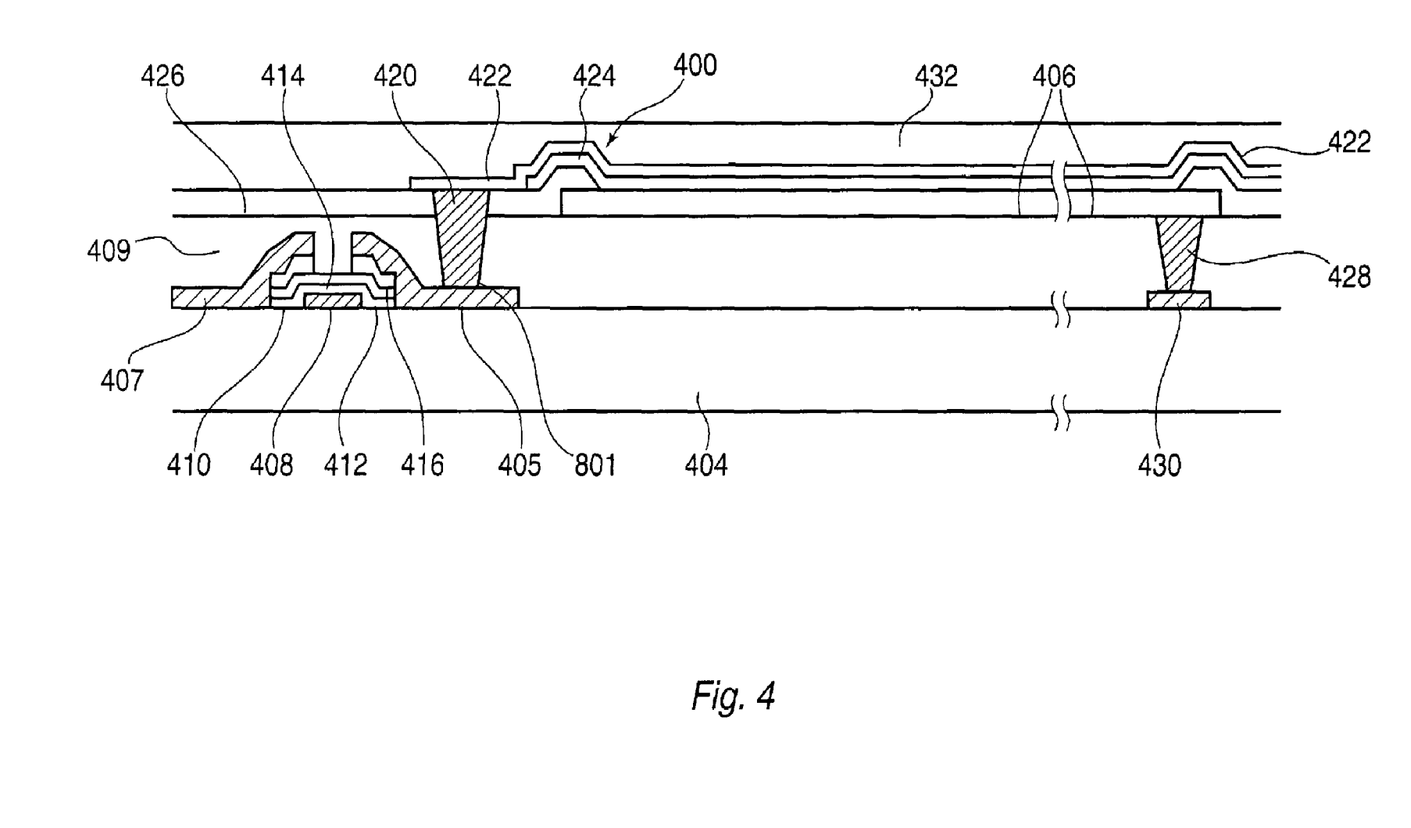
FIG. 4 shows an OLED and a thin film transistor in accordance with an embodiment of the present invention.

FIG. 4 shows an OLED 400 and transistor 410 in accordance with an embodiment of the present invention. The OLED 400 and transistor 410 may be elements of an array such as shown in FIG. 3, as further explained below.

Substrate 404 may be any suitable substrate known to the art. Ceramic, plastic, and glass are examples of suitable substrate materials. Substrate 404 may be flexible or inflexible. Where substrate 404 is flexible, preferred substrate materials include plastic and metal foils. Substrate 404 may be transparent or opaque. Substrate 404 and anode 406 may be any suitable material or combination of materials known to the art, such that anode 406 may be adapted to inject holes into a p-doped layer. Anode 406 and substrate 404 may be sufficiently transparent to create a bottom emitting device. A preferred substrate and anode combination, which is transparent, is commercially available ITO (anode) deposited on glass or plastic (substrate). Preferred anode materials include conductive metal oxides and metals. A hole-injection enhancement layer may be used to increase the injection of holes from anode 406 into a p-doped layer.

Transistor 410 is formed over substrate 404. The transistor includes a gate 408, source region 405 and drain region 407. Between the gate 408 and the source and drain regions 405 and 407, there may be three layers, a SiNx layer, an intrinsic a—Si layer 414 and a n+a—Si layer 416.

The transistor 410 is connected to the OLED 400 through via 420, which may be filled with a metal plug, for example. The via 420 connects the source region 405 of transistor 410 to the cathode 422 of OLED 400.

The OLED 400 includes the cathode 422, organic layer 424, and anode 406. Anode 406 may be any suitable anode material known to the art. Dielectric layer 426 may define boundries of the OLED. Via 428 connects the anode 406 of OLED 400 to bus line 430. A passivation layer 409 is formed over transistor 410, substrate 404 and bus line 430.

Organic layer 424 may be any suitable organic material that emits light when sufficient current is passed between anode 406 and cathode 422. Organic layer 424 may also comprise organic layers in addition to an organic emissive layer, such as those of a double heterostructure configuration, with a separate hole transport layer, an emissive layer, and an electron transport layer. Many organic hole transport, emissive, and electron transport materials are known to the art, and may be used with embodiments of the present invention. Organic layer 424 may comprise other configurations known to the art, such as single heterostructure or single layer. Organic layer 424 may include other layers not shown. For example, organic layer 424 may include blocking layers adapted to confine charge carriers in an emissive layer, which are described in more detail in U.S. patent application Ser. No. 10/173,682 to Forrest et al., filed Jun. 18, 2002, which is incorporated by reference in its entirety. Organic layer 424 may include a buffer layer disposed beneath cathode 422, that protects underlying organic layers during the deposition of cathode 422, as described in more detail in U.S. patent application Ser. No. 09/931,948 to Lu et al., filed Aug. 20, 2001, which is incorporated by reference in its entirety. Organic layer 424 may include other layers that provide an advantage to the OLED device. Preferably, the emissive layer is a phosphorescent material, due to the high efficiencies associated with such materials, but other types of materials, such as fluorescent materials, may also be used. Organic layer 424 may be deposited by any technique known to the art, including organic vapor phase deposition (OVPD), such as disclosed in U.S. Pat. No. 6,337,102, which is incorporated herein by reference in its entirety, and thermal vapor phase deposition. As used herein, the term "organic" includes polymeric materials as well as small molecule organic materials.

Organic layer 424 may include an emissive layer, which may be any suitable organic emissive material. Preferably, the emissive layer is a phosphorescent emissive material, although fluorescent emissive materials may also be used. Phosphorescent materials are preferred because of the higher luminescent efficiencies associated with such materials. Many emissive materials have resistivity that is significant, so it is also preferable to minimize the thickness of emissive layer, while still having a thickness sufficient to ensure a contiguous layer.

Cathode 422 may be any suitable material or combination of materials known to the art, such that cathode 422 is adapted to inject electrons into an n-doped layer (not shown). Cathode 422 may be sufficiently transparent to create a top emitting device. Both cathode 422 and anode 406 may be transparent, partially transparent, or substantially transparent to create a transparent OLED. Preferred transparent electrode materials include ITO, zinc-indium-tin oxide, and other materials, used in conjunction with a thin low-work function layer. Preferred opaque cathodes include LiF/Al and other materials known to the art. An electron-injection enhancement layer may be used to increase the injection of electrons from cathode 422 into the n-doped layer.

One or more transparent electrodes may be useful in an organic opto-electronic device. For example, OLED devices are generally intended to emit light through at least one of the electrodes. For OLEDs from which the light emission is only out of the bottom of the device, that is, only through the substrate side of the device, a transparent anode material, such as indium tin oxide (ITO), may be used as the bottom electrode. Since the top electrode of such a device does not need to be transparent, such a top electrode, which is typically a cathode, may be comprised of a thick and reflective metal layer having a high electrical conductivity. In contrast, for transparent or top-emitting OLEDs, a transparent cathode such as disclosed in U.S. Pat. Nos. 5,703,436 and 5,707,745 may be used. As distinct from a bottom-emitting OLED, a top-emitting OLED is one which may have an opaque and/or reflective substrate, such that light is produced only out of the top of the device and not through the substrate. In addition, a fully transparent OLED that may emit from both the top and the bottom.

Also show in FIG. 4 is an encapsulation layer 432. The encapsulation layer 432 may be formed over the entire structure to protect it from the environment. Other encapsulants, such as a metal lid or a glass lid secured by a perimeter or face seal may be used. An encapsulant is preferred but not necessary.

FIGS. 5–8 illustrate possible processing flow for forming a pixel, including the OLED 400, transistor 410, and a switching transistor 502. These figures are further explained below.

Figure 5:
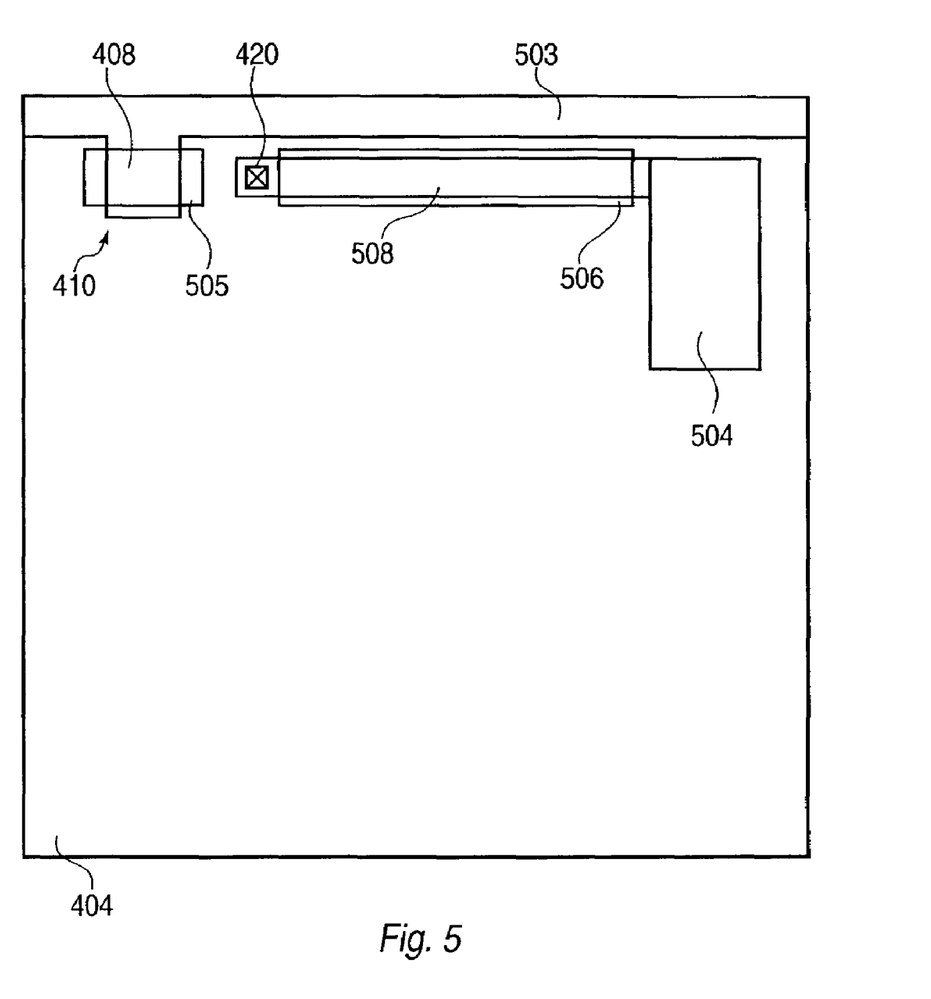
FIG. 5 shows processing steps in forming the OLED device of an embodiment of the present invention.

FIG. 5 illustrates initial processing steps. First, over the substrate 404 is formed a gate line 503, which may be formed from a metal, such as Chromium, which is patterned to form a gate 408, gate 508, and the bottom electrode 504 of a storage capacitor. Then the active regions 505 and 506 are deposited, which may be formed from the three layer SiNx layer, an intrinsic a-Si layer, and a n+ a-Si layer as described above. The via hole 420 is then formed in gate 102.

Figure 6:
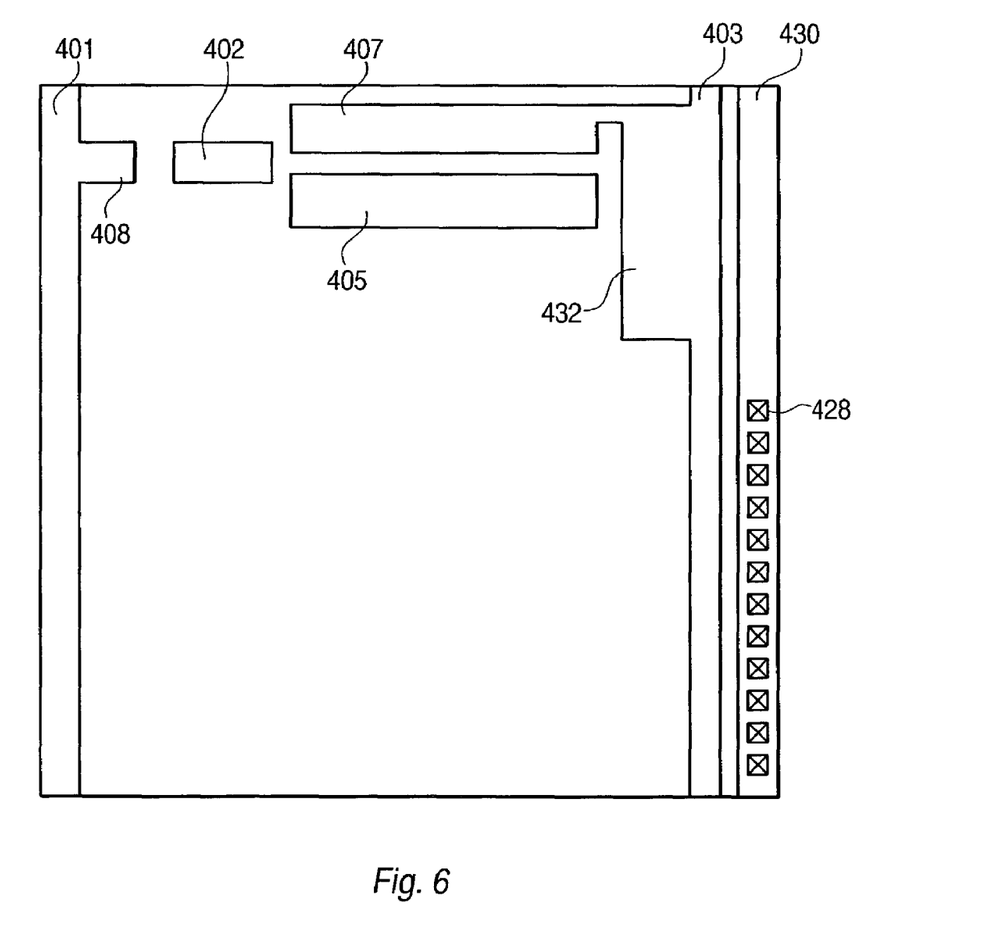
FIG. 6 shows processing steps in forming the OLED device of an embodiment of the present invention.

The elements in FIG. 6 are then formed over the elements in FIG. 5. A source/drain level metal (e.g. Mo) is deposited and patterned to form dataline 401, source/drain 408, contact 402, drain 405 and source 407, ground line 403, a top electrode 432 of the storage capacitor and ITO bus line 430. The T1–T2 contact 402 contacts gate 102 through vias 428. The vias may be formed with one via hole as shown in FIG. 4, or may be formed from a plurality of via holes as shown in FIG. 6.

Then, n+ amorphous silicon is etched using metal ground line 403, drain 405 and source 407, and source/drain 408 as a mask. Next, contact annealing is performed. A passivation layer is then deposited over the tfts and planarizing occurs to form a flat surface. The structure is contact annealed to improve contact between the metal and n+ Sia layer. Via holes 428 are formed in the passivation layer to the bus line 430, and metal plugs are formed therein.

Figure 7:
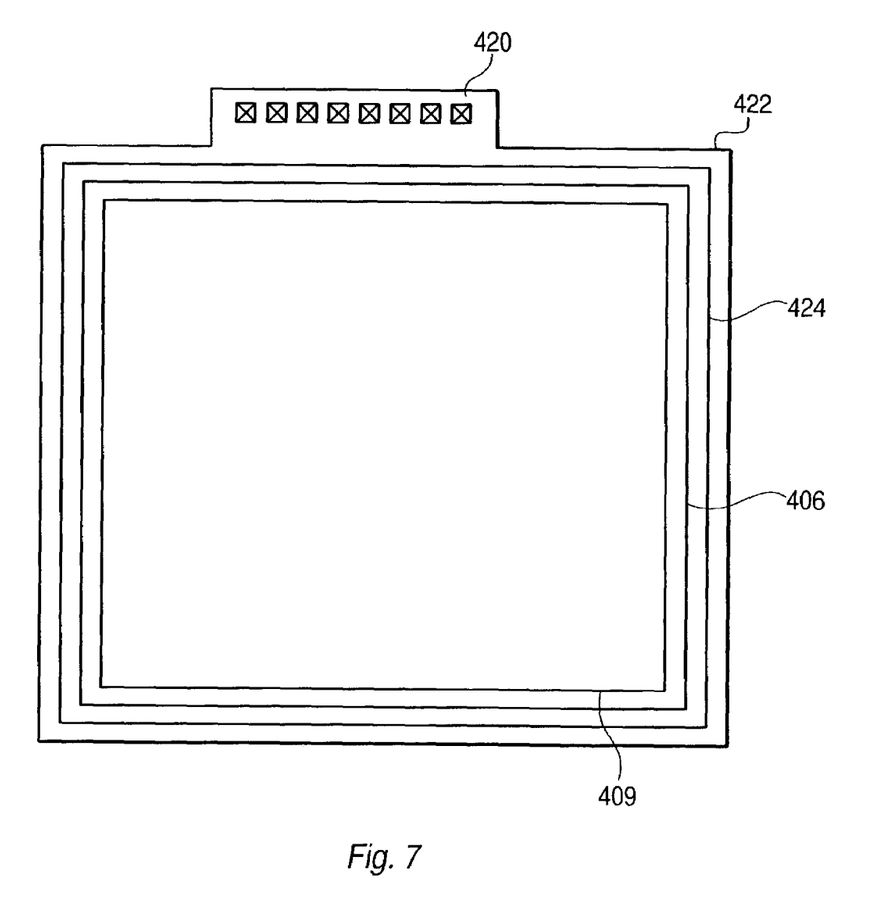
FIG. 7 shows processing steps in forming the OLED device of an embodiment of the present invention.

The elements in FIG. 7 are then formed over the elements in FIG. 6. An ITO layer is deposited and patterned to form anode 406. Anode 406 is formed so as to cover vias 428 shown in FIG. 6 to contact ITO bus line 430. Dielectric layer 409 is then deposited. Vias 420 are then formed above drain 405, and metal plugs may be formed therein. A shadowmask may then be used to deposit organic layer 424. Cathode 422 is then deposited through a shadowmask, overlapping the vias 420 so that the cathode 422 connects to the drain 405 by the metal plug in vias 420.

The above described process flow is only one possible process flow that could be used in connection with embodiments of the present invention. Any known variation of this process flow that results in the structure described herein can be used with embodiments of the present invention. For example, instead of depositing the organic layer through the shadow mask and depositing the cathode through a shadowmask, a two dimensional integrated shadowmask could be formed around the OLED opening, the organic layer could be deposited, and the cathode 422 could be deposited without a mask. In another embodiment, shadowmasks for the organic layer and the cathode could be adjusted to have a same shape, the organic layer could be first deposited, and then the shadowmask could be slid over the organic layer to deposit the cathode.

Figure 8:
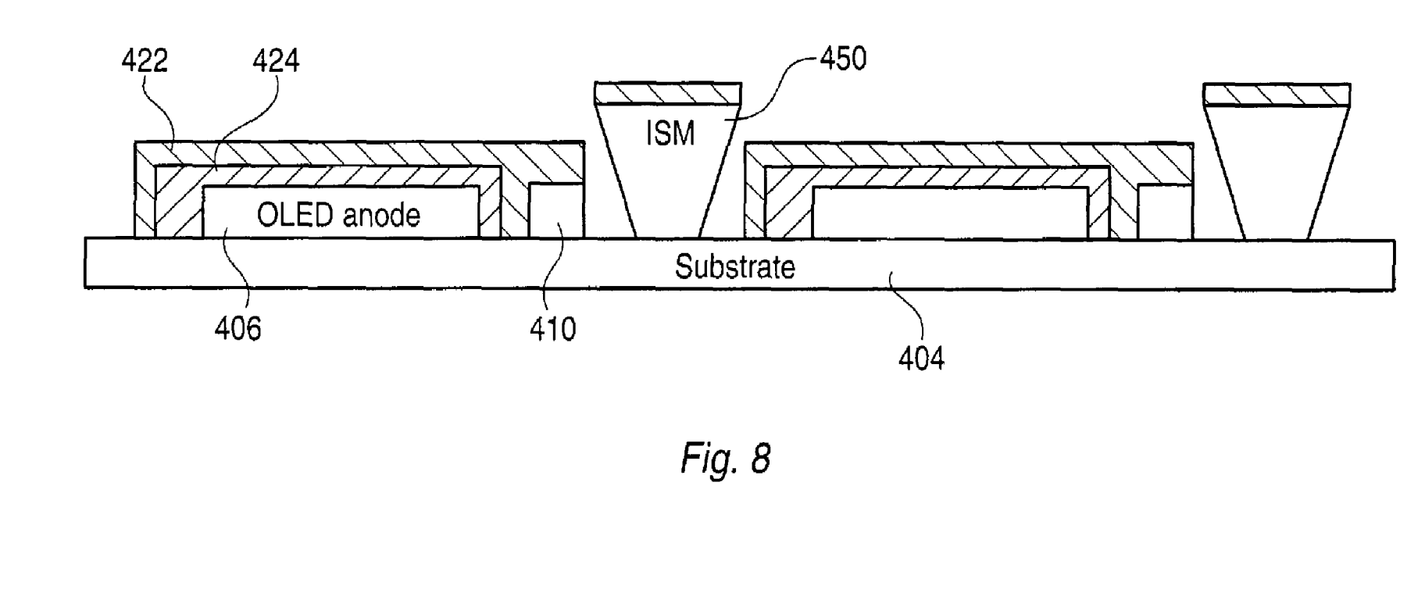
FIG. 8 shows how an embodiment of the present invention may be fabricated through the use of an integrated shadow mask.
Figure 9:
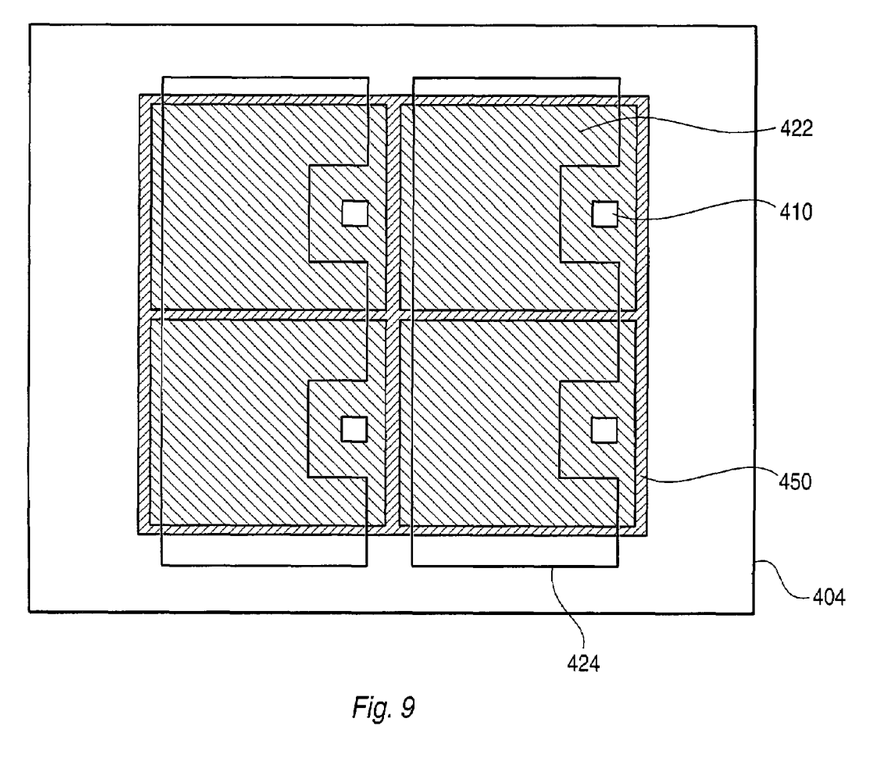
FIG. 9 shows how the an embodiment of the present invention may be fabricated through the use of an integrated shadow mask

FIGS. 8 and 9 shows how embodiments of the present invention may be fabricated through the use of an integrated shadow mask (ISM), which may be fabricated prior to OLED fabrication. First the OLED anode 406, indium tin oxide for example, may be patterned around the n-type transistors 410. This could be done with one large contact pad covering the device with islands (openings) within the contact pad where the transistor contact pads are. The organic layers 424 are then deposited through a shadow mask to overlap the idium tin oxide. The cathodes 422 are then deposited in a pattern overlapping the ITO/organic region and making contact to individual transistors, as shown in FIG. 9. This can be done using a conventional shadow mask or by constructing an integrated shadow mask on the substrate. While this method may be used to efficiently manufacture embodiments of the present invention, it should be noted that any method of forming an n-type transistor having a current-carrying electrode connected to the cathode of the OLED is within the scope of the present invention.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device, comprising:
    an n-type transistor fabricated over a substrate, the n-type transistor having a gate and two current-carrying electrodes; and
    a non-inverted organic light emitting device fabricated over the substrate, the non-inverted organic light emitting device having an anode and a cathode, the cathode being connected to one of the current-carrying electrodes of the n-type transistor, wherein the cathode of the organic light emitting device is connected directly to one of the current-carrying electrodes of the n-type transistor.

2. The device of claim 1, wherein the n-type transistor is an n-type thin film transistor.

3. The device of claim 1, further comprising an integrated shadow mask over the substrate.

4. The device of claim 1, wherein the n-type transistor is a driving n-type transistor.

5. The device of claim 1, wherein the current-carrying electrode to which the cathode is connected functions as a drain.

6. The device of claim 1, wherein a current through the organic light emitting device and the n-type transistor is substantially independent of a current-voltage characteristic of the organic light emitting device.

7. The device of claim 1, wherein the n-type transistor is one of: a) a polycrystalline silicon thin film transistor; b) an amorphous thin film transistor; c) a cadmium selenide thin film transistor; or d) an organic thin film transistor.

8. The device of claim 1, wherein the organic light emitting device is phosphorescent.

9. The device of claim 1, wherein the device is flexible.

10. The device of claim 9, wherein the substrate includes a material selected from the group consisting of metal foil or plastic.

11. The device of claim 1, wherein the cathode is substantially transparent.

12. The device of claim 1, wherein the electronic device is top-emitting.

13. The device of claim 1, wherein a data voltage required to turn on the n-type transistor is less than about 10 volts.

14. The device of claim 1, further comprising an encapsulation layer formed over the organic light emitting device.

15. The device of claim 1, wherein a data voltage required to turn on the n-type transistor does not include a voltage across the organic light emitting diode.

16. A lighting device, comprising the device of claim 1.

17. A display device, comprising the device of claim 1.

18. A method of forming a device, comprising:
    fabricating an n-type transistor over a substrate, the n-type transistor having a gate and two current-carrying electrodes; and
    fabricating a non-inverted organic light emitting device over the substrate, the non-inverted organic light emitting device having an anode and a cathode, the cathode being connected to one of the current-carrying electrodes of the n-type transistor, wherein the cathode of the organic light emitting device is connected directly to one of the current-carrying electrodes of the n-type transistor.

19. The method of claim 18, wherein the n-type transistor is an n-type thin film transistor.

20. The method of claim 18, further comprising fabricating the non-inverted organic light emitting device with an integrated shadow mask.

21. The method of claim 18, wherein the n-type transistor is a driving n-type thin film transistor.

22. The method of claim 18, wherein a current through the organic light emitting device and the n-type transistor is substantially independent of a current-voltage characteristic of the organic light emitting device.

23. The method of claim 18, wherein the current-carrying electrodes to which the cathode is connected functions as a drain.

24. The method of claim 18, wherein the n-type transistor is one of: a) a polycrystalline silicon thin film transistor; b) an amorphous thin film transistor; c) a cadmium selenide thin film transistor; or d) an organic thin film transistor.

25. The method of claim 18, wherein the organic light emitting device is phosphorescent.

26. The method of claim 18, wherein the device is flexible.

27. The method of claim 26, wherein the substrate includes a material selected from the group consisting of a metal foil or plastic.

28. The method of claim 18, wherein the cathode is substantially transparent.

29. The method of claim 18, further comprising forming the device as a top-emitting device.

30. The method of claim 18, wherein a data voltage required to turn on the n-type transistor is less than about 10 volts.

31. The method of claim 18, further comprising forming an encapsulation layer over the organic light emitting device.

32. The method of claim 18, wherein a data voltage required to turn on the n-type transistor does not include a voltage across the organic light emitting diode.

33. A method of forming a lighting device, comprising forming the device of claim 18.

34. A method of forming a display device, comprising forming the device of claim 18.

* * * * *

UNITED STATES PATENT AND TRADEMARK OFFICE
CERTIFICATE OF CORRECTION

PATENT NO. : 7,049,636 B2
APPLICATION NO. : 10/281218
DATED : May 23, 2006
INVENTOR(S) : Weaver et al.

It is certified that error appears in the above-identified patent and that said Letters Patent is hereby corrected as shown below:

Column 4, line 60, change "boundries" to -- boundaries --;

Column 6, line 38, change "tfts" to -- thin film transistor substrate --; and

Column 7, line 10, change "idium" to -- indium --.

Signed and Sealed this

Twenty-first Day of November, 2006

JON W. DUDAS
*Director of the United States Patent and Trademark Office*